United States Patent [19]

Shrivastava et al.

[11] Patent Number: 5,701,264
[45] Date of Patent: Dec. 23, 1997

[54] DYNAMIC RANDOM ACCESS MEMORY CELL HAVING INCREASED CAPACITANCE

[75] Inventors: Ritu Shrivastava, Fremont; Chitranjan N. Reddy, Los Altos Hills, both of Calif.

[73] Assignee: Alliance Semiconductor Corporation, San Jose, Calif.

[21] Appl. No.: 792,460

[22] Filed: Jan. 31, 1997

Related U.S. Application Data

[63] Continuation of Ser. No. 571,393, Dec. 13, 1995, abandoned.

[51] Int. Cl.$^6$ .................................................. H01L 27/108
[52] U.S. Cl. .......................... 365/149; 257/306; 257/309
[58] Field of Search .................................. 365/149, 182; 257/296, 300, 306, 309

[56] References Cited

U.S. PATENT DOCUMENTS

| | | | |
|---|---|---|---|
| 5,053,351 | 10/1991 | Fazan et al. | 437/52 |
| 5,434,812 | 7/1995 | Tseng | 365/149 |
| 5,504,704 | 4/1996 | Sato | 365/182 |

OTHER PUBLICATIONS

Ema et al., "3-Dimensional Stacked Capacitor Cell for 16M and 64M DRAMs", *IEDM*, pp. 592–595, 1988.

*Primary Examiner*—David C. Nelms
*Assistant Examiner*—Son Mai
*Attorney, Agent, or Firm*—Bradley T. Sako

[57] ABSTRACT

A dynamic random access memory cell and method of fabrication thereof are disclosed. An access transistor (10) is formed in a substrate (12). The deposition of a first dielectric layer (20) follows. A plurality of conductive layers (22–30) are deposited, with alternating layers (24 and 28) having a higher dopant concentration than the other layers (22, 26 and 30). A contact hole (32) is etched through the conductive layers (22–30) and the first dielectric layer (20) to the substrate (12). A contact layer (36) is then deposited, making contact with the substrate (12) and each conductive layer (22–30). The conductive layers (22–30) and contact layer (36) are patterned with an isotropic etch selective to the higher doped layers (24 and 28). The resulting structure is a conductive member (42) with a peripheral side surface (44) having inset furrows (40) formed by the selective etching of the higher doped layers (24 and 28). A conformal capacitor dielectric (46) is formed over the conductive structure (42). A conductive plate layer (46) is formed over the capacitor dielectric (46).

20 Claims, 4 Drawing Sheets concentration

DYNAMIC RANDOM ACCESS MEMORY CELL HAVING INCREASED CAPACITANCE

This application is a continuation of application Ser. No. 08/571,393 filed on Dec. 13, 1995 now abandoned.

TECHNICAL FIELD

The present invention relates generally to dynamic random access memories (DRAMs) and more particularly to DRAM memory cells that employ storage capacitors.

BACKGROUND OF THE INVENTION

Dynamic random access memory (DRAM) cells typically include two devices, a storage capacitor and an access transistor. Data are read from cells by activating the access transistor and determining if charge is present in the storage capacitor. Data are written to the cells by either charging or discharging the storage capacitor, according to the logic to be stored. Due to charge leakage, in order to maintain the integrity of the stored data, the storage capacitors must be periodically refreshed by reading the stored values, and immediately rewriting them back into the cells. The compact arrangement presented by DRAM cells provides for high density memory designs.

While advances in semiconductor fabrication technology continue to shrink minimum device geometries, the reduction of DRAM cells present a particular problem. While the access transistor may continue to shrink, reduction in the size of the storage capacitor results in a direct reduction in the amount charge stored, hence, a smaller signal for the charge sensing circuit to detect.

Various approaches have addressed the need for higher capacitance DRAM storage capacitors. Reduced dielectric thickness, higher permittivity dielectrics (such as nitrided silicon oxides), and dopant implants to increase field strength, have all resulted in increases in cell capacitance.

Alternate approaches have focused on increasing capacitor surface area. It is know in the prior art to fabricate "trench" storage capacitors that extend into the substrate. A drawback to such approaches is the complicated set of fabrication steps that are required.

"Stacked" capacitor structures are also known in the prior art. Commonly owned, copending U.S. patent application Ser. No. 456,080, filed on May 31, 1995 and entitled DRAM CELL WITH SELF-ALIGNED CONTACT AND METHOD OF FABRICATING SAME, incorporated by reference herein, discloses a stacked capacitor cell that is self-aligned with the gate of its associated access transistor.

U.S. Pat. No. 5,053,351 issued to Fazan et al. on Oct. 10, 1991 illustrates a stacked capacitor process for forming stacked capacitors having an "E" shaped cross section.

Stacked capacitor cells having "fin" structures are disclosed in "3-Dimensional Stacked Capacitor Cell for 16M and 64M DRAMS" by Ema et al., in *IEDM Tech. Dig.*, pp. 592–595, 1988. The Ema et al. reference sets forth a method of fabricating a DRAM cell capacitor in which alternating layers of polysilicon and a dielectric layer are deposited. A contact hole is etched through these layers to the substrate. A layer of polysilicon is then deposited into the contact hole and over a top layer of dielectric, making contact with the substrate and the underlying polysilicon layers. The inter-poly dielectric layers are subsequently etched away. A capacitor dielectric layer is formed on the resulting polysilicon structure, and a final plate layer of polysilicon is deposited over the capacitor dielectric.

A drawback of the prior art approaches set forth in Fazan et al. and Ema et al. is the limited area provided to make electrical contact between the contact polysilicon layer and the other laterally extending polysilicon fin structures. Processing defects can easily result in noncontact between these structures, reducing the overall capacitance of the cell and causing potential reliability and yield problems. Further, the terminal edges of the fin structures can have sharp angles which can result in higher field strengths leading to lower breakdowns or increased leakage of the capacitor dielectric. This can also adversely affect the long term reliability of the cell. Additionally, proper formation of the fin structure is dependent upon the mechanical integrity between the fins and the contact layer (created by the polysilicon deposited into the contact hole). Poor contact between the fins and the contact layer can result in capacitor structure having weak mechanical integrity.

Clearly it would be desirable to provide a DRAM capacitor cell structure that provides increased capacitance without the resulting adverse features inherent in the prior art.

SUMMARY OF THE INVENTION

According to the present invention, a DRAM cell includes a capacitor having a conductive member composed of horizontally disposed layers. The conductive member has a generally vertical surrounding peripheral surface with inset furrows formed by the preferential etch of one or more of the horizontally disposed layers. The conductive member is covered with a capacitor dielectric. The capacitor dielectric is then covered with a conductive plate member. The conductive member and plate member form the two electrodes of the capacitor.

According to one aspect of the present invention the different horizontally disposed layers are formed by multiple deposition steps.

According to another aspect of the present invention different horizontally disposed layers are formed by ion implanting one layer to create a sharp diffusion gradient within that layer.

According to another aspect of the present invention the conductive member further includes a contact hole extending through the horizontally disposed layers, and a conductive contact member extending into the contact hole making electrical contact with both the horizontally disposed layers and the substrate.

According to another aspect of the present invention a metal-oxide-semiconductor (MOS) access transistor is formed in the substrate having a side wall insulated gate structure, and the contact of the capacitor is self-aligned with the gate.

According to another aspect of the present invention the conductive layers are formed from deposited polysilicon, with alternating layers being highly doped. An isotropic polysilicon etch is used to form the irregular outer surface and/or irregular contact surface.

Other objects and advantages of the invention will become apparent in light of the following description thereof.

DETAILED DESCRIPTION OF THE EMBODIMENTS

FIGS. 1a–1g illustrate, in a series of sectional side views, the fabrication of a DRAM cell according to a preferred embodiment of the present invention.

Figure 1A:
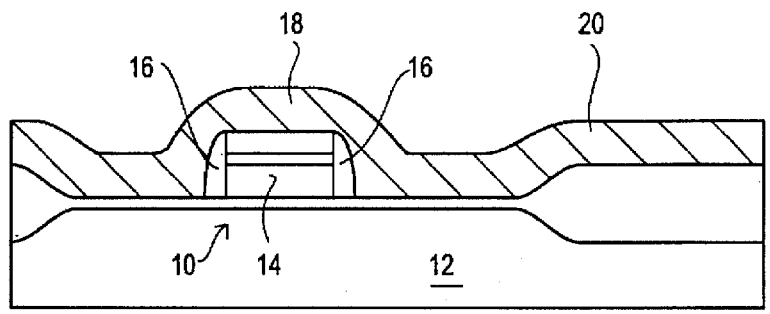
FIGS. 1a–1g are sectional side views illustrating the fabrication of the DRAM cell according to a preferred embodiment.

FIG. 1a illustrates the memory cell after the formation of an access transistor 10. In a preferred embodiment the access transistor 10 is a MOS transistor (an active device) fabricated according to well understood techniques on a monocrystalline silicon substrate 12. The transistor includes a polysilicon gate 14 having sidewalls 16 and a cap 18 composed of a dense insulating material. This arrangement allows for the self-alignment of source and drain contacts (active device terminals) with the gate 14. A first dielectric layer 20 has been deposited over the transistor 10. In a preferred embodiment, the first dielectric layer 20 is composed of TEOS, and has a thickness of approximately 1000 Å.

Figure 1B:
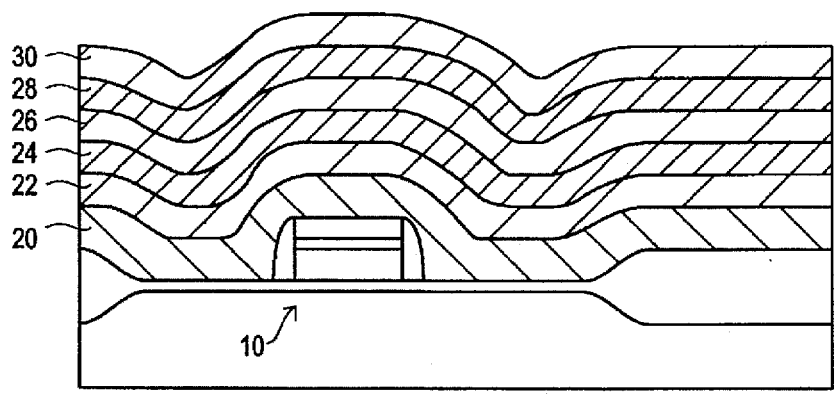

FIG. 1b illustrates the memory cell following the deposition of multiple conductive layers. A first conductive layer 22 is deposited on the first dielectric layer 20. The second through fifth conductive layers (24–30) are then deposited, one on top of the other, over the first conductive layer 22. The conductive layers (22–30) are selected so that one or more have a different etch rates than the others when subjected to a certain etch.

In a preferred embodiment the conductive layers (22–30) are composed of doped polysilicon with variable etch rates in the layers being achieved by variations in impurity doping. Each conductive layer is doped, but the second and fourth layers (24 and 28) receive a higher concentration relative to the first, third and fifth layers (22, 26 and 30). The concentration difference between the layers exceed several orders of magnitude (e.g. $10^{15}$ cm3 vs. $10^{20}$ cm3). Thus, when subjected to an isotropic polysilicon etch, the second and fourth layers (24 and 28), due to their high doping concentration, will etch at a faster rate than the first, third, and fifth layers (22, 26 and 30).

The conductive layers (22–30) are deposited using well known chemical vapor deposition (CVD) techniques. Each conductive layer (22–30) has a thickness of approximately 800 Å. Doping concentrations are achieved with ion implantation.

Figure 1C:
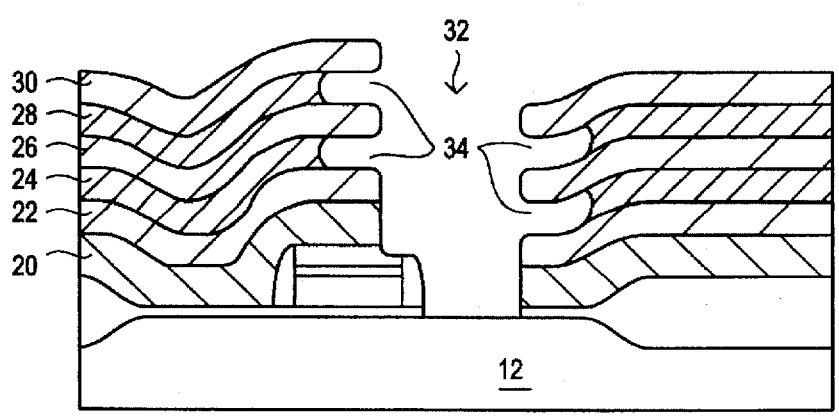

FIG. 1c illustrates the memory cell following a contact etch step. Conventional photolithographic techniques have been used to create an etch mask for a contact hole. The contact hole 32 is formed by etching through each of the conductive layer (22–30) and the first dielectric layer 20 down to the substrate 12. The contact hole 32 is formed with a contact etch that includes a polysilicon etch preferential to highly doped polysilicon. In addition, the etch has a certain degree of isotropy. As a result, the second and fourth layers (24 and 28) are preferentially etched as the contact is formed, creating inset contact furrows 34. It is noted that the contact hole is self-aligned, allowing for greater tolerances in contact misalignment. Isotropic polysilicon etch methods, selective to higher doped polysilicon, are well understood in the art, and will not be discussed in any further detail herein.

Figure 1D:
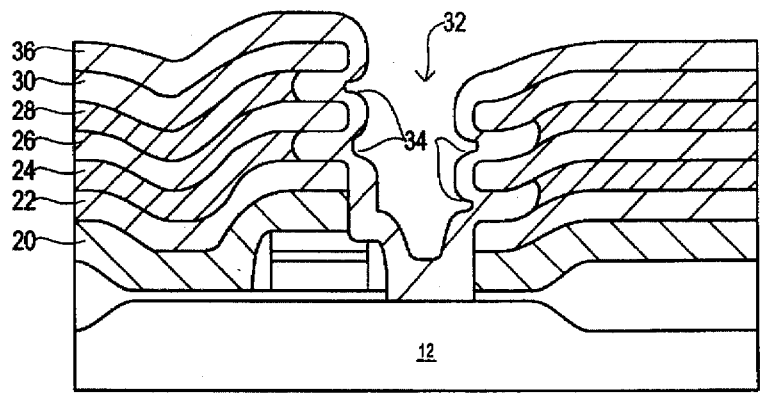

FIG. 1d illustrates the memory cell following the deposition of a conductive contact layer 36. The contact layer 36 extends over the fifth conductive layer 30 and into the contact hole 32. As is shown in the figure, the contact layer 36 makes electrical contact with all the conductive layers (22–30) and the substrate 12. In a preferred embodiment, the contact layer 36 is polysilicon deposited using CVD techniques, and is doped using ion implantation. The doping concentration is lower than the second and fourth polysilicon layers (24 and 28). The contact layer 36 conforms to the contact furrows 34 set within the contact hole 32, and so has a contoured shape within the contact hole 32. The contact layer 36 is formed of polysilicon having a vertical thickness of approximately 800 Å, and a doping concentration generally equivalent to that of first, third and fifth conductive layers(22, 26 and 30).

Following the deposition of the contact layer 36, a pattern etch mask 38 is formed over the contact layer 36. The pattern etch mask 38 masks a portion of the contact layer 36 peripheral to the contact hole 32. The pattern etch mask 38 is formed from photoresist using well known photolithographic techniques.

Following the formation of the pattern etch mask 38, the conductive layers (22–36), including the contact layer 36 are patterned using a polysilicon etch preferential to highly doped polysilicon, and having a high degree of isotropy. The memory cell following the isotropic etch is set forth in FIG. 1e.

Figure 1E:
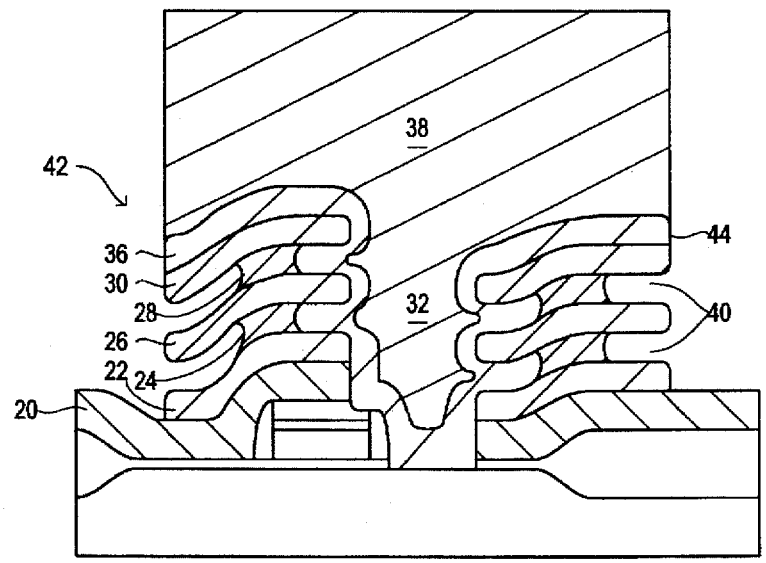

As shown in the sectional view of FIG. 1e, all the conductive layers (24–30 and 36) have been etched down to the first dielectric layer 20, with the second and fourth layers (24 and 28) etching at a faster rate than the other layers. The resulting structure includes inset peripheral furrows 40. It is noted that the combination of the remaining portions of conductive layers (22 to 30), and the remaining portion of the contact layer 36 form an integral, conductive member 42, having a peripheral side surface 44 containing the peripheral furrows 40. The conductive member 42 functions as the first electrode of the DRAM cell storage capacitor.

It is noted that the use of a polysilicon etch that is selective to highly doped silicon results in the rounding of features on the conductive member 42. Prior art approaches using alternating polysilicon and oxide layers can create sharp angled polysilicon edges after the oxide is etched away. This results in high field strengths during the operation of the cell. This can degrade the overall life of the capacitor structure. The rounded features of the conductive member 42 reduces this effect. Additionally, unlike prior art approaches where a contact layer makes contact with only the edges of the "fin" structures, in the present invention, all conductive layers (22–30) are in contact with each other. Further, the faster etch layers (24 and 28) lend mechanical support to the conductive member 42 that is superior to prior art approaches.

Figure 1F:
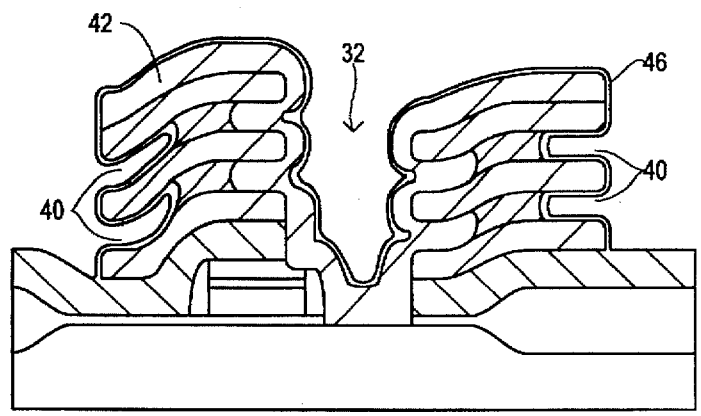

Referring now to FIG. 1f, the memory cell is shown after the pattern etch mask 38 has been stripped away, and a capacitor dielectric 46 has been formed on the exposed surfaces of the conductive member 42. The capacitor dielectric 46 conforms to the contours of the conductive member 42, including the surfaces within the peripheral furrows 40 and the contact hole 32.

In a preferred embodiment the capacitor dielectric includes alternating layers of silicon dioxide, silicon nitride and silicon dioxide (ONO), for a total thickness of approximately 50–100 Å. The capacitor dielectric is formed by oxidizing the exposed polysilicon surface of the conductive member, depositing a thin layer of silicon nitride over the silicon oxide, and then oxidizing the silicon nitride to create a second layer of silicon dioxide.

Figure 1G:
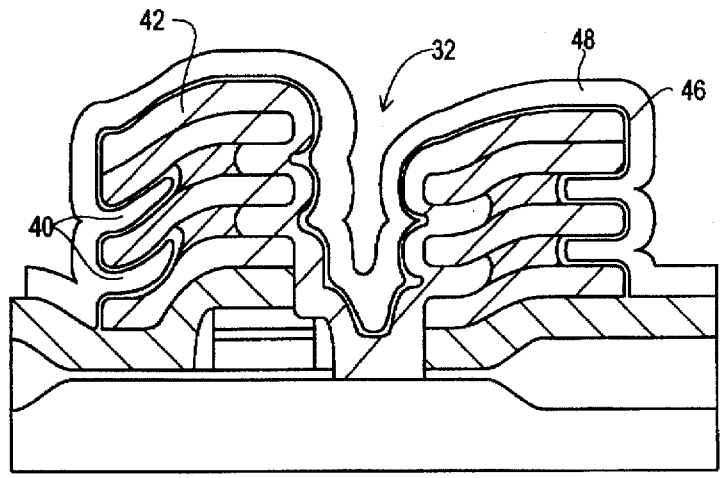

Referring now to FIG. 1g, the memory cell is set forth, following the deposition of a conductive plate layer 48 which completes the formation of the memory cell. The conductive plate layer 48 conformally covers the capacitor dielectric 46, extending completely into the peripheral furrows 40 and the irregular surface defining the contact hole 32. The plate layer 48 functions as the second electrode of the DRAM storage capacitor.

In a preferred embodiment, the plate layer is formed from CVD polysilicon, has a vertical thickness of approximately 800 Å, and is contiguous with more than one storage capacitor structure.

The fabrication of the memory cell concludes with conventional techniques, including the formation of an insulating layer (not shown) over the plate layer 48, bit lines contacting the access transistor, and higher level interconnects. As these steps are incidental to the present invention, and well understood to one skilled in the art, they shall be omitted from this description.

Figure 2:
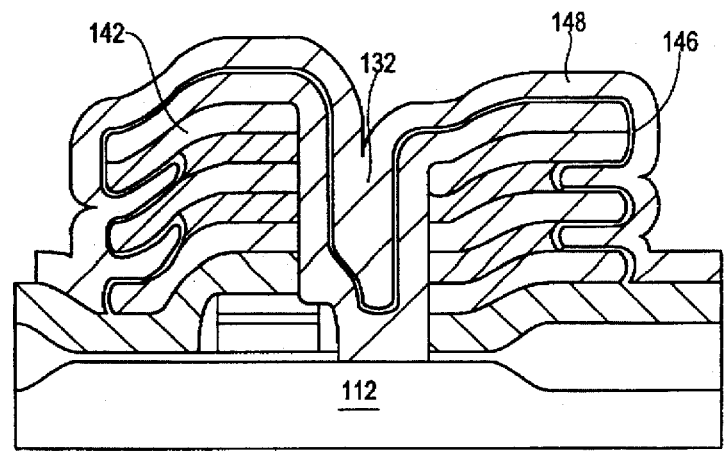
FIG. 2 is a sectional side view of a DRAM cell according to a first alternate embodiment of the present invention.

FIG. 2 illustrates a first alternate embodiment of the present invention. The first alternate embodiment is fabricated according to same general steps as set forth in FIGS. 1a–1g, except that the contact hole 132 is formed using an anisotropic etch. As a result, the surface defining the contact hole 132 is generally vertical with respect to the substrate 112, and has no inset contact furrows.

Figure 3A:
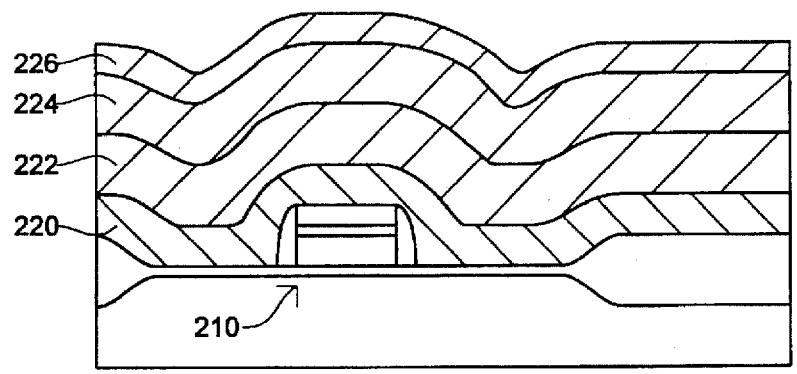
FIGS. 3a–3c are sectional side views illustrating the a second alternate embodiment of the present invention.
Figure 3B:
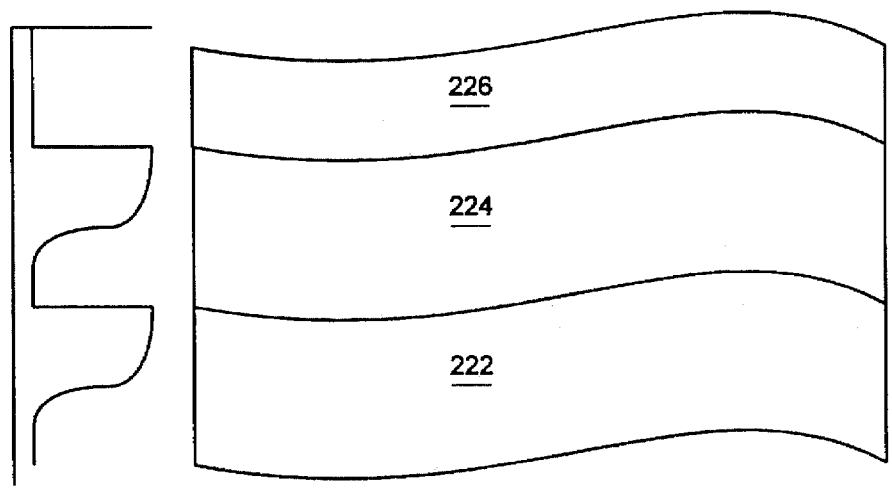

FIGS. 3a and 3b illustrate a second alternate embodiment. According to the second alternate embodiment, conductive horizontal layers having preferential etch rates are fabricated by ion implanting polysilicon layers so as to create a sharp vertical impurity gradients therein.

Referring now to FIG. 3a, a memory cell according to the present invention is illustrated in a side cross sectional view following the formation of an access transistor 210 and the deposition of a first dielectric 220. Further, a first conductive layer 222, second conductive layer 224, and third conductive layer 226 have also been deposited.

The first and second conductive layers (222 and 224) are formed of polysilicon deposited by well know CVD techniques. Unlike the previously described embodiments, the first and second conductive layers (222 and 224) have been doped by ion implantation so as to create a sharp dopant concentration gradient.

Set forth in FIG. 3b is a graph depicting of the concentration profiles of the first through third conductive layers (222–226). The bottom portions of the first and second layers (222 and 224) have a lower doping concentration than the top portions. The third conductive layer 226 has a uniform doping that is lower than the heavily doped portions of the first and second layers (222 and 224).

In the second alternate embodiment, following the formation of conductive layers with sharp vertical diffusion gradients, the fabrication steps are essentially the same as those set forth in FIGS. 1b–1g. A self-aligned contact hole is etched through the conductive layers to the substrate. The etch used is preferential to highly doped polysilicon, and isotropic. As a result, the higher doped top portions of the first and second layers (222 and 224) etch in a lateral direction at a faster rate than the bottom portions. This creates inset contact furrows 234.

A conductive contact layer 236 is then deposited onto the third conductive layer 226 and into to the contact hole 232, making contact with the substrate 212 and the other conductive layers (222 and 224). The conductive contact layer 236 is deposited using the same techniques as the contact layer in FIG. 1d.

Figure 3C:
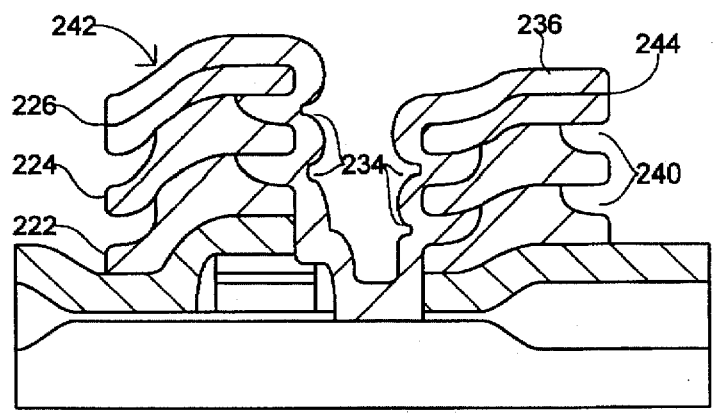

A pattern etch mask, similar to that set forth in FIG. 1e, is then formed over the contact layer 236. An isotropic polysilicon etch, selective to higher doped polysilicon is then applied. The resulting structure is set forth in FIG. 3c. As in the case of the contact hole 232 formation, the higher doped top portions of the first and second layers (222 and 224) etch at a faster rate than the lower doped portions. The remaining portions of the first through third conductive layers (222–226) in conjunction with the contact layer 236 form an integral conductive member 242. The conductive member 242, like that of FIG. 1e, has a surrounding peripheral side surface 244 with inset peripheral furrows 240.

The second alternate embodiment concludes with the same subsequent steps as described in conjunction with FIGS. 1f and 1g. A capacitor dielectric is formed over the conductive member 242 and a conductive plate layer deposited over the capacitor dielectric.

It is understood that one skilled in the art could arrive at numerous, different dopant concentration gradients. Multiple ion implantations of varying doses, and greater or fewer conductive layers are just a few of the variations possible. Concave and convex profiles could also be generated.

It is noted that while the embodiments set forth herein illustrate a capacitor structure having a contact layer that extends into a contact hole and makes contact with the substrate, the present invention should not be limited thereto. Any of the conductive layers could be used to make contact with an active device by etching a contact hole at an earlier point in the fabrication process. Such a contact need not be centrally located within the capacitor structure.

Further, the particular implementation of higher doping concentrations to create inset furrows should not be construed as limiting. Just a few of the many variations possible could include employing alternating conductive layers composed of entirely different materials. An etch selective to low doping concentrations could also be used.

Accordingly, as will be apparent to one skilled in the art, the invention has been described in connection with its preferred embodiments, and may be changed, and other embodiments derived, without departing from the spirit and scope of the invention.

What we claim is:

1. In a dynamic random access memory (RAM) formed on a semiconductor substrate, a memory cell having improved capacitance, comprising:

a conductive contact member;

a conductive layered member formed from a plurality of stacked conductive members in electrical contact with one another, said layered member having a peripheral side surface with at least one inset peripheral furrow therein defined by the stacked conductive members and a generally vertical contact hole therein, forming an inner generally vertical hole surface, the contact hole extending through said layered member to a portion of the substrate, the contact member extending into the hole and making electrical contact with the layered member and a portion of the substrate, the layered member and contact member collectively forming a conductive member having an outer surface;

a capacitor dielectric covering the outer surface of said stacked member;

a conductive plate member covering at least a portion of the capacitor dielectric; and an active device in contact with either said conductive plate member or said conductive contact member, said active device including a first terminal coupled to the portion of the substrate, a second terminal and a third terminal for controlling the conductive path between the first and second terminal.

2. The memory cell of claim 1 wherein:

the stacked conductive members of said layered member includes a plurality of conductive layers having alternating sizes.

3. The memory cell of claim 2 wherein:

said peripheral furrow is formed by one of said stacked conductive members being inset with respect to at least one other stacked conductive member.

4. The memory cell of claim 2 wherein:

said stacked conductive members are formed from doped polysilicon, with at least one stacked conductive member having a different dopant concentration than the other stacked conductive members.

5. The memory cell of claim 1 wherein:

said contact member is formed from polysilicon.

6. The memory cell of claim 1 wherein:

said capacitor dielectric conformally covers the peripheral side surface including the peripheral furrow; and said plate member conformally covers said capacitor dielectric and extends into the peripheral furrow.

7. The memory cell of claim 1 wherein:

at least one of the stacked conductive members is formed by at least one conductive layer having a vertical doping gradient.

8. The memory cell of claim 7 wherein:

the peripheral furrow includes a profile that corresponds to the vertical doping gradient.

9. The memory cell of claim 1 wherein:

said active device, in contact with said conductive contact member is a metal-insulator-silicon FET having a gate, a source, and a drain;

the portion of the substrate is coupled either the source or the drain; and said contact hole is self-aligned with the gate.

10. The memory cell of claim 1 wherein:

said active device is in contact with said conductive plate member; and the portion of the substrate is one of the power supply nodes of the DRAM.

11. The memory cell of claim 1 wherein:

the contact hole includes at least one inset contact furrow.

12. The memory cell of claim 11 wherein:

the contact furrow is formed by one of said stacked conductive members being inset with respect to at least one other stacked conductive member.

13. The memory cell of claim 11 wherein:

said layered member is formed by at least one stacked conductive member having a vertical doping gradient; and the contact furrow includes a profile that corresponds to the vertical doping gradient.

14. A dynamic random access memory (DRAM) cell formed on a semiconductor substrate, comprising;

a gate member formed on said substrate, said gate member including a top surface and opposing side surfaces;

sidewall insulator members formed on at least one side surface of said gate member; and a capacitor structure extending over at least a portion of said gate member, said capacitor structure including a stacked member formed from a plurality of conductive stacked layers in electrical contact with one another having an irregular outer surface formed by etching at least one of the conductive stacked layers at a different rate than the other conductive stacked layers, a contact hole extending through said stacked member and a first dielectric layer to a portion of the substrate, the contact hole being self-aligned with the gate member, a contact member making electrical contact with the portion of the substrate and the stacked member, a capacitor dielectric covering at least the irregular outer surface of said stacked member, and a plate member covering said capacitor dielectric.

15. The (DRAM) cell of claim 14, wherein:

the stacked conductive layers are formed from polysilicon having dopants therein, at least two of the stacked conductive layers having different dopant concentrations.

16. The (DRAM) cell of claim 15, wherein:

the dopants of the stacked conductive layers result in an increase in the conductivity of the stacked conductive layers.

17. In a dynamic random access memory (DRAM) a storage cell, comprising;

a first conductive element formed over a semiconductor substrate;

a protective dielectric formed over said first conductive element;

a contact region formed within the semiconductor substrate adjacent to said first conductive element;

a conductive member having a peripheral vertical surface with an irregular aspect, said conductive member being formed over said first conductive element and said contact region; and a vertically extending contact aperture formed through said conductive member to said contact region, at least a portion of said contact aperture overlapping said first conductive element and terminating at said protective dielectric to form a self-aligned contact aperture with said first conductive element; and a contact member formed over said conductive member extending into said contact aperture to make contact with said contact region.

18. The storage cell of claim 17, wherein:

said first conductive element is the word line of a DRAM.

19. The storage cell of claim 17, wherein:

said conductive member includes a plurality of stacked semiconductor members, each semiconductor member being doped to increase its conductivity.

20. The storage cell of claim 19, wherein:

at least one of the stacked semiconductor members has a different dopant concentration than one of the other stacked semiconductor members.

\* \* \* \* \*